United States Patent
Adachi et al.

(10) Patent No.: US 11,282,997 B2
(45) Date of Patent: Mar. 22, 2022

(54) THERMOELECTRIC CONVERSION MATERIAL, THERMOELECTRIC CONVERSION ELEMENT AND PRODUCTION METHOD OF THERMOELECTRIC CONVERSION MATERIAL

(71) Applicant: SUMITOMO ELECTRIC INDUSTRIES, LTD., Osaka (JP)

(72) Inventors: Masahiro Adachi, Osaka (JP); Makoto Kiyama, Osaka (JP); Yoshiyuki Yamamoto, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 129 days.

(21) Appl. No.: 16/620,048

(22) PCT Filed: Apr. 18, 2018

(86) PCT No.: PCT/JP2018/015945
§ 371 (c)(1),
(2) Date: Dec. 6, 2019

(87) PCT Pub. No.: WO2018/225388
PCT Pub. Date: Dec. 13, 2018

(65) Prior Publication Data
US 2020/0105992 A1  Apr. 2, 2020

(30) Foreign Application Priority Data
Jun. 8, 2017 (JP) .............................. JP2017-113266

(51) Int. Cl.
*H01L 35/26* (2006.01)
*H01L 35/16* (2006.01)
(Continued)

(52) U.S. Cl.
CPC .............. *H01L 35/26* (2013.01); *H01L 35/16* (2013.01); *H01L 35/18* (2013.01); *H01L 35/34* (2013.01)

(58) Field of Classification Search
CPC ......... H01L 35/14; H01L 35/16; H01L 35/18; H01L 35/20; H01L 35/22; H01L 35/26
(Continued)

(56) References Cited

U.S. PATENT DOCUMENTS 4,491,679 A * 1/1985 Moore .................... H01L 35/16
136/203
2003/0089391 A1 * 5/2003 Fukudome .............. H01L 35/16
136/227
(Continued)

FOREIGN PATENT DOCUMENTS

JP   H08-111546 A   4/1996
JP   2003-31860 A   1/2003
(Continued)

OTHER PUBLICATIONS

Takiguchi et al, Nano Structural and Thermoelectric Properties of SiGeAu, 2011 Jpn. J. Appl. Phys. 50 041301 (Year: 2011).*

*Primary Examiner* — Andrew J Golden
(74) *Attorney, Agent, or Firm* — Faegre Drinker Biddle & Reath LLP

(57) ABSTRACT

A plate-shaped thermoelectric conversion material having a first main surface and a second main surface on the opposite side of the first main surface is formed of semiconductor grains that are in contact with one another. The semiconductor grains each include a particle composed of a semiconductor containing an amorphous phase, and an oxidized layer covering the particle. The distance between the first main surface and the second main surface exceeds 0.5 mm.

16 Claims, 4 Drawing Sheets

(51) Int. Cl.
*H01L 35/18* (2006.01)
*H01L 35/34* (2006.01)

(58) Field of Classification Search
USPC .................................. 136/200–242
See application file for complete search history.

(56) References Cited

U.S. PATENT DOCUMENTS

| | | | | |
|---|---|---|---|---|
| 2008/0087314 | A1* | 4/2008 | Xiao | H01L 35/26 |
| | | | | 136/201 |
| 2010/0193001 | A1* | 8/2010 | Hirono | H01L 35/18 |
| | | | | 136/205 |
| 2012/0217447 | A1 | 8/2012 | Murai et al. | |
| 2017/0069811 | A1* | 3/2017 | Kurosaki | H01L 35/16 |
| 2019/0019935 | A1* | 1/2019 | Nishide | H01L 35/22 |

FOREIGN PATENT DOCUMENTS

| | | |
|---|---|---|
| JP | 2011-91321 A | 5/2011 |
| JP | 2013-74051 A | 4/2013 |
| JP | 2017-84987 A | 5/2017 |

* cited by examiner

THERMOELECTRIC CONVERSION MATERIAL, THERMOELECTRIC CONVERSION ELEMENT AND PRODUCTION METHOD OF THERMOELECTRIC CONVERSION MATERIAL

TECHNICAL FIELD

The present disclosure relates to a thermoelectric conversion material, a thermoelectric conversion element, and a method for producing a thermoelectric conversion material. The present application claims priority to Japanese Application No. 2017-113266 filed Jun. 8, 2017, the entire contents of which are incorporated herein by reference.

BACKGROUND ART

The properties of thermoelectric conversion materials (thermoelectric conversion properties) can be evaluated through the dimensionless figure of merit (ZT) defined by formula (1) below:

$$ZT = S^2 \sigma T/\kappa \quad (1)$$

In formula (1), Z represents the figure of merit, T represents the absolute temperature, S represents the Seebeck coefficient, σ represents the electrical conductivity, and κ represents the thermal conductivity. The larger the dimensionless figure of merit, the higher the conversion efficiency in thermoelectric conversion. In other words, a material having a large dimensionless figure of merit is a material that has excellent thermoelectric conversion properties. As apparent from formula (1), the dimensionless figure of merit increases as the thermal conductivity decreases. In order to reduce the thermal conductivity of the thermoelectric conversion material, use of a thermoelectric conversion material having a structure that contains an amorphous phase is considered. More specifically, there has been proposed a thermoelectric conversion material having a structure that contains an amorphous phase obtained by quenching a bismuth (Bi)-based composition in a molten state at a cooling rate of $10^4$ to $10^6$ K/second (for example, refer to PTL 1).

CITATION LIST

Patent Literature

PTL 1: Japanese Unexamined Patent Application Publication No. 8-111546

SUMMARY OF INVENTION

A thermoelectric conversion material of the present disclosure is a plate-shaped thermoelectric conversion material having a first main surface and a second main surface on the opposite side of the first main surface, in which the thermoelectric conversion material is formed of multiple semiconductor grains in contact with one another.
The semiconductor grains each include a particle composed of a semiconductor containing an amorphous phase, and an oxidized layer covering the particle.
The distance between the first main surface and the second main surface exceeds 0.5 mm.

DESCRIPTION OF EMBODIMENTS

Figure 1:
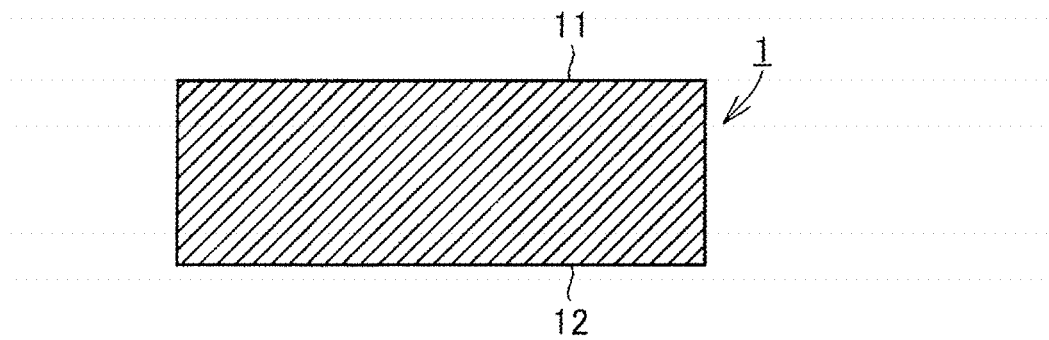
FIG. 1 is a schematic cross-sectional view of a cross-section of a thermoelectric conversion material cut in the thickness direction.

In order to improve the thermoelectric conversion properties of the thermoelectric conversion material, it is preferable to increase the dimensionless figure of merit. For power generation applications that require high output, the thermoelectric conversion material is preferably in a thick bulk form. One example of a method for obtaining a thermoelectric conversion material is a liquid quenching method that involves quenching by pouring a composition in a molten state onto an outer circumferential surface of a copper roller rotating in the circumferential direction. A thermoelectric conversion material obtained by the liquid quenching method has a thin strip shape.
A thermoelectric conversion material obtained as such has a small thickness as is, and sufficient output is not obtained therefrom.

One of the objects is to provide a thermoelectric conversion material that has excellent thermoelectric conversion properties and enables high output.

Description of Embodiments of Present Disclosure

First, embodiments of the present disclosure are listed and described. A thermoelectric conversion material of the present disclosure is a plate-shaped thermoelectric conversion material having a first main surface and a second main surface on the opposite side of the first main surface, in which the thermoelectric conversion material is formed of multiple semiconductor grains in contact with one another. The semiconductor grains each include a particle composed of a semiconductor containing an amorphous phase, and an oxidized layer covering the particle. The distance between the first main surface and the second main surface exceeds 0.5 mm.

As is apparent from formula (1) above, the dimensionless figure of merit can be increased by increasing the Seebeck coefficient. Moreover, the dimensionless figure of merit can also be increased by decreasing the thermal conductivity. The particles composed of a semiconductor have a high Seebeck coefficient. The particles composed of a semiconductor containing an amorphous phase have a low thermal conductivity. The thermoelectric conversion material of the present disclosure is composed of semiconductor grains that have particles composed of a semiconductor containing an amorphous phase. In this manner, in the thermoelectric conversion material, the Seebeck coefficient can be increased while decreasing the thermal conductivity. The semiconductor grains have oxide layers covering the particles. In this manner, the Seebeck coefficient of the thermal conductivity can be further increased. Thus, the dimensionless figure of merit of the thermoelectric conversion material can be increased. The oxidized layers do not have to completely cover the particles. For example, the Seebeck coefficient can be further increased as long as the coverage is 50% or more. Moreover, a thermoelectric conversion material having a first main surface and a second main surface more than 0.5 mm distant from each other (thickness) can be obtained by the semiconductor grains that contact one another. At a thickness exceeding 0.5 mm, a large electric current can flow smoothly, and, thus, power generation output can be further increased. In this manner, the temperature difference generated in the thermoelectric conversion material can be increased, and output can be obtained by a high voltage. As such, according to the thermoelectric conversion material of the present disclosure, a thermoelectric conversion material that has excellent thermoelectric conversion properties and enables high output can be provided.

In the thermoelectric conversion material described above, the first main surface and the second main surface may have a hardness of 2 GPa or more. In this manner, the thermoelectric conversion material exhibits high mechanical strength and does not break easily when vibrated during use.

In the thermoelectric conversion material described above, the first main surface and the second main surface may have a Young's modulus of 40 GPa or more. In this manner, the thermoelectric conversion material exhibits high mechanical strength and does not break easily when vibrated during use.

In the thermoelectric conversion material described above, the particle may contain a nanocrystal phase that is precipitated in the amorphous phase and is composed of a crystal having a particle diameter of less than 15 nm. When the particle contains a nanocrystal phase, the thermal conductivity of the particle can be further decreased. Moreover, when the particle diameter is less than 15 nm, phonon scattering is enhanced, and thus the thermal conductivity is decreased. Accordingly, the thermal conductivity of the thermoelectric conversion material composed of semiconductor grains having the particle described above can be decreased. As a result, the dimensionless figure of merit of the thermoelectric conversion material can be increased.

In the thermoelectric conversion material described above, the particle may be an MnSi-based material containing Mn and Si. An MnSi-based material containing Mn and Si is preferable as the material that constitutes the thermoelectric conversion material.

In the thermoelectric conversion material described above, the particle may be an SiGe-based material containing Si and Ge. An SiGe-based material containing Si and Ge is preferable as the material that constitutes the thermoelectric conversion material.

In the thermoelectric conversion material described above, the thermoelectric conversion material may have a Seebeck coefficient of 50 μV/K or more. In this manner, the dimensionless figure of merit of the thermoelectric conversion material can be increased.

A thermoelectric conversion element of the present disclosure includes a thermoelectric conversion material unit, a first electrode disposed to be in contact with the thermoelectric conversion material unit, and a second electrode disposed to be in contact with the thermoelectric conversion material unit and to be apart from the first electrode. The thermoelectric conversion material unit consists of the thermoelectric conversion material described above, in which the component composition is adjusted to set the conductivity type to p-type or n-type.

A thermoelectric conversion element of the present disclosure includes a thermoelectric conversion material unit composed of the aforementioned thermoelectric conversion material that has excellent thermoelectric conversion properties and enables high output, in which the component composition is adjusted to set the conductivity type to p-type or n-type. Thus, according to the thermoelectric conversion element of the present disclosure, a thermoelectric conversion element having excellent conversion efficiency and enabling high output can be easily provided.

A method for producing the thermoelectric conversion material of the present disclosure is a method for producing a thermoelectric conversion material in which semiconductor grains are in contact with one another. The method for producing a thermoelectric conversion material includes a step of preparing powder bodies composed of semiconductor grains containing amorphous phases, and a step of obtaining a formed body formed by applying a pressure of 1.5 GPa or more to the powder bodies while maintaining the powder bodies at a temperature lower than or equal to a crystallization temperature of the powder bodies.

In order to obtain a thermoelectric conversion material in a thick bulk form, performing consolidation is considered. Examples of the consolidation method include a spark plasma sintering method and a hot press method. In the methods described above, a pressure of about 50 MPa is applied, and sintering is performed at high temperature. Regarding the thermoelectric conversion material in which a structure containing an amorphous phase is formed to reduce the thermal conductivity, when consolidation is performed by the above-described method, the thermoelectric conversion material becomes crystallized, and the thermal conductivity of the thermoelectric conversion material rises. Meanwhile, decreasing the temperature to suppress crystallization of the thermoelectric conversion material decreases the mechanical strength of the thermoelectric conversion material.

In the method for producing a thermoelectric conversion material of the present disclosure, a formed body is obtained by forming by applying a pressure of 1.5 GPa or more to the powder bodies. In this manner, a formed body in which powder bodies composed of adjacent semiconductor grains in contact with one another is obtained. Thus, the thermoelectric conversion material exhibits high mechanical strength. The powder bodies composed of semiconductor grains containing amorphous phases are formed while maintaining the powder bodies at a temperature lower than or equal to the crystallization temperature of the powder bodies. In this manner, crystallization of the powder bodies is suppressed, and the decrease in thermal conductivity can be suppressed. As described above, a thermoelectric conversion material having excellent thermoelectric conversion properties while maintaining high mechanical strength can be provided even when the forming temperature is lower than in the spark plasma sintering method or hot press method. Thus, according to the method for producing a thermoelectric conversion material of the present disclosure, a thermoelectric conversion material having high mechanical strength and excellent thermoelectric conversion properties can be provided.

In the method for producing a thermoelectric conversion material described above, in the step of obtaining a formed body, the pressure applied to the powder bodies may be isotropic pressure. In this manner, the mechanical strength of the thermoelectric conversion material can be further increased.

The method for producing a thermoelectric conversion material described above may further include a step of precipitating a nanocrystal phase in the semiconductor grains by heating the formed body. In this manner, a thermoelectric conversion material that contains an amorphous phase and a nanocrystal phase in the semiconductor grains can be provided.

Detailed Description of Embodiments of Present Disclosure

Next, one embodiment of the thermoelectric conversion material of the present disclosure is described with reference to the drawings. In the drawings described below, the same or corresponding parts are denoted by the same reference numerals, and the descriptions therefor are not repeated.

Embodiment 1

FIG. 1 is a schematic cross-sectional view of a cross-section of a thermoelectric conversion material cut in the thickness direction. Referring to FIG. 1, a thermoelectric conversion material 1 has a plate shape and has a first main surface 11 and a second main surface 12 positioned on the opposite side of the first main surface 11. The thickness of the thermoelectric conversion material 1 refers to the minimum value of the distance between two parallel planes that contact the outer circumferential surface of the thermoelectric conversion material 1. Referring to FIG. 1, the thickness in the thickness direction from the first main surface 11 to the second main surface 12 of the thermoelectric conversion material 1 is larger than 0.5 mm. The thickness of the thermoelectric conversion material 1 is preferably 0.8 mm or more. In this manner, the temperature difference generated in the thermoelectric conversion material 1 can be further increased, and output can be obtained by a high voltage. The upper limit of the thickness of the thermoelectric conversion material 1 is, for example 300 mm or less, preferably 10 mm or less, and more preferably 8 mm or less. In one example, the thermoelectric conversion material 1 has a disk shape having a diameter of 10 mm and a thickness of 5 mm.

The first main surface 11 and the second main surface 12 of the thermoelectric conversion material 1 of this embodiment have a hardness of 2 GPa or more. The hardness of the thermoelectric conversion material 1 is preferably 3 GPa or more. There has been no bulk-form thermoelectric conversion material having a thickness exceeding 0.5 mm that has such a hardness. Thus, due to such a hardness, the thermoelectric conversion material can exhibit high mechanical strength. The hardness of the thermoelectric conversion material 1 is a value measured with a nanoindenter in accordance with ISO 14577:2002. More specifically, measurement is performed with a nanoindenter (for example, iMicro produced by Nanomechanics, Inc.) at an indentation depth of 2 um, an oscillation frequency of 100 Hz, and an amplitude of oscillation of 2 nm. Measurement is carried out on ten points, and the average value is determined.

The first main surface 11 and the second main surface 12 of the thermoelectric conversion material 1 of this embodiment have a Young's modulus of 40 GPa or more. The Young's modulus of the thermoelectric conversion material 1 is preferably 55 GPa or more. There has been no bulk-form thermoelectric conversion material having a thickness exceeding 0.5 mm that has such a Young's modulus. Thus, due to such a Young's modulus, the thermoelectric conversion material exhibits high mechanical strength. The Young's modulus of the thermoelectric conversion material 1 is a value measured with a nanoindenter in accordance with ISO 14577:2002. More specifically, measurement is performed with a nanoindenter (for example, iMicro produced by Nanomechanics, Inc.) at an indentation depth of 2 um, a oscillation frequency of 100 Hz, and an amplitude of oscillation of 2 nm. Measurement is carried out on ten points, and the average value is determined.

The Seebeck coefficient of the thermoelectric conversion material 1 of this embodiment is 50 μV/K or more. The Seebeck coefficient of the thermoelectric conversion material 1 is preferably 100 μV/K or more. In this manner, the dimensionless figure of merit of the thermoelectric conversion material 1 can be increased. The Seebeck coefficient of the thermoelectric conversion material 1 is calculated by generating a temperature difference between two ends of a sample and measuring the thermoelectromotive force. For example, the measurement is conducted by using an electrical thermoelectric property measurement system (RZ2001i produced by Ozawa Science Co., Ltd.).

Figure 2:
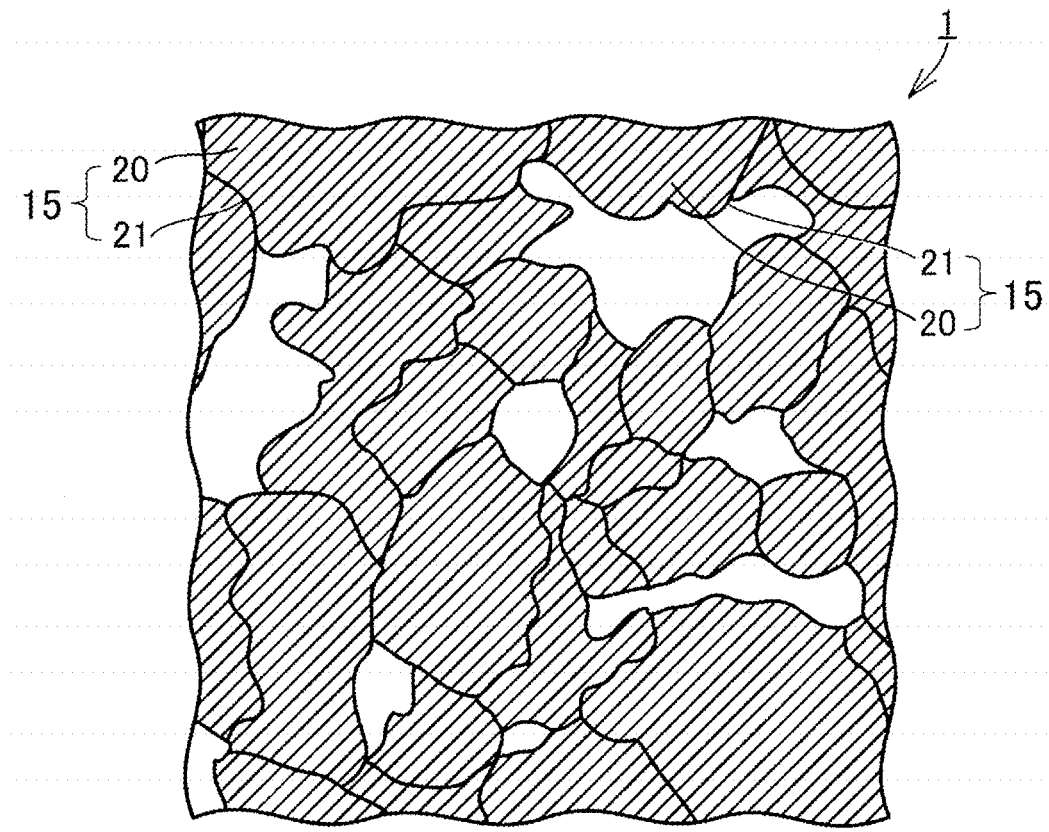
FIG. 2 is a schematic diagram of a part of a cross-section of a thermoelectric conversion material cut in the thickness direction.

FIG. 2 is a schematic diagram of a part of a cross-section of the thermoelectric conversion material 1 cut in the thickness direction. Referring to FIG. 2, the thermoelectric conversion material 1 configured so that semiconductor grains 15 are in contact with one another. The semiconductor grains 15 are grains having a matrix composed of a semiconductor. The contours of the semiconductor grains 15 are irregular. The surfaces of the semiconductor grains 15 have fine recesses and protrusions. Referring to FIG. 2, under observation, the semiconductor grains 15 appear to have recesses and protrusions interlocked with one another. The unhatched regions in FIG. 2 indicate voids. It is assumed that the mechanical strength of the thermoelectric conversion material 1 composed of the semiconductor grains 15 is high. The semiconductor grains 15 each include a particle 20 composed of a semiconductor and an oxidized layer 21 covering the particle 20. The particle 20 composed of a semiconductor has a high Seebeck coefficient. The particle 20 contains an amorphous phase 22. Thus, the thermal conductivity of the particle 20 is reduced. Referring to FIG. 2, the particle 20 is covered with the oxidized layer 21. In this manner, the Seebeck coefficient of the thermoelectric conversion material 1 can be increased. The Seebeck coefficient increases presumably because of the energy filtering effect generated by the oxidized layer 21 serving as an energy barrier for the carrier, with which only carriers with high energy migrate past the energy barrier.

The semiconductor constituting the particle 20 is an MnSi-based material containing Mn and Si in this embodiment. The semiconductor constituting the particle 20 may be an SiGe-based material, a BiTe-based material, an SnSe-based material, a CuSe-based material or the like instead of the MnSi-based material of this embodiment. From the viewpoint of handling ease, an MnSi-based material or an SiGe-based material is preferable. The semiconductor constituting the particle 20 may contain a combination of two or more of the aforementioned materials.

The MnSi-based material contains Mn and Si and is represented by the compositional formula, $Mn_X Si_Y$. In this compositional formula, $0.90 \leq X \leq 1.10$ and $0.75 \leq Y \leq 5.70$ are satisfied. The melting point becomes 1000° C. or lower when a component composition with X and Y in the aforementioned ranges is employed. Thus, in the particle 20 constituted by the MnSi-based material, an amorphous phase is more easily formed. As a result, the thermal conductivity can be further reduced, and the thermoelectric conversion properties can be improved.

The MnSi-based material may contain Mn, Si, and Al and may be represented by the compositional formula, $Mn_XSi_YAl_Z$. In this compositional formula, $0.40 \leq X \leq 1.0$, $0.00 < Z \leq 3.67$, $1.50 \leq Y+Z \leq 5.70$, and $Y \geq 0.43Z$ may be satisfied. The melting point becomes 1000° C. or lower when a component composition with X, Y and Z in the aforementioned ranges is employed. Thus, the amorphous phase can be more easily formed.

The SiGe-based material contains Si and Ge and is represented by the compositional formula, $Si_ZGe_{1-Z}$. In this compositional formula, $0<Z<1$ is satisfied. The BiTe-based material is a semiconductor material that contains Bi and Te. As the BiTe-based material, for example, $Bi_2Te_3$ can be used. The SnSe-based material is a semiconductor material that contains Sn and Se. As the SnSe-based material, for example, SnSe can be used. The CuSe-based material is a semiconductor material that contains Cu and Se. As the CuSe-based material, for example, CuSe can be used.

Figure 3:
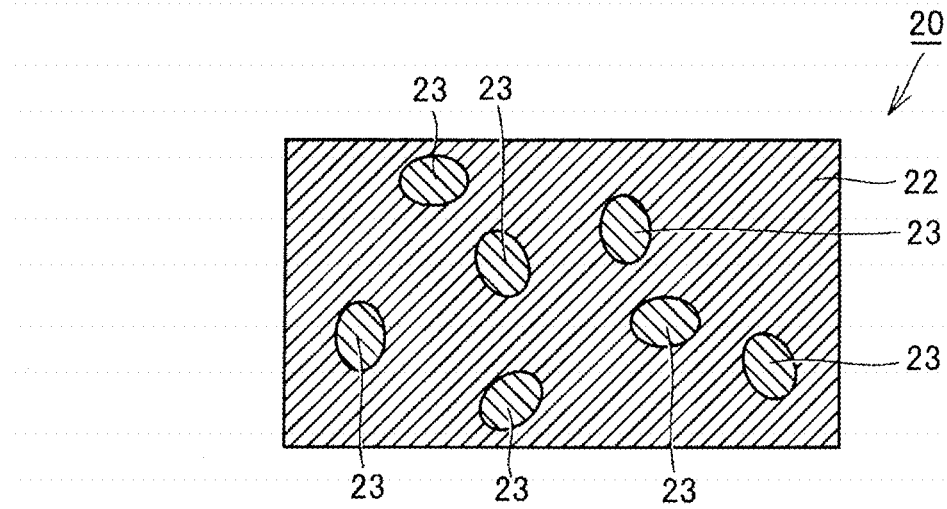
FIG. 3 is a schematic diagram illustrating the structure of a particle.

Referring to FIG. 3, as one example, the particle 20 may contain an amorphous phase 22 and a nanocrystal phase 23 precipitated in the amorphous phase 22. The particle 20 may be configured to contain more than one nanocrystal phase 23. The nanocrystal phase 23 is composed of a crystal having a particle diameter of less than 15 nm. In this manner, in the particle 20, the thermal conductivity can be further decreased. Thus, the thermal conductivity of the thermoelectric conversion material composed of semiconductor grains 15 including the particles 20 can be further decreased. The particle diameter of the nanocrystal phase is preferably less than 10 nm and more preferably less than 6 nm. As a result, the thermal conductivity can be reduced. The particle diameter of the nanocrystal phase contained in the particle 20 is calculated by the Scherrer's equation on the basis of the X-ray diffraction analysis (XRD) measurement results.

The particle 20 may further contain 30 at % or less of at least one element selected from the group consisting of Cu, Ni, Fe, and Au. In this manner, the particle diameter of the crystal constituting the nanocrystal phase can be easily controlled. The particle 20 may contain 0.01 at % or more of the aforementioned additional additive element. The particle 20 may contain 10 at % or less or 1 at % or less of the aforementioned additional additive element.

As is apparent from formula (1) above, the dimensionless figure of merit can be increased by increasing the Seebeck coefficient. Moreover, the dimensionless figure of merit can also be increased by decreasing the thermal conductivity. The Seebeck coefficient of the particle 20 composed of a semiconductor is increased The thermal conductivity of the particle 20 composed of a semiconductor containing the amorphous phase 22 is decreased. The thermoelectric conversion material 1 of embodiment 1 is composed of multiple semiconductor grains 15 each including a particle 20 composed of a semiconductor containing an amorphous phase 22. In this manner, in the thermoelectric conversion material 1, the Seebeck coefficient can be increased while decreasing the thermal conductivity. The semiconductor grain 15 includes an oxidized layer 21 disposed to surround the outer circumferential surface of the particle. In this manner, the Seebeck coefficient of the thermoelectric conversion material 1 can be further increased. Thus, the dimensionless figure of merit of the thermoelectric conversion material 1 can be increased. Moreover, a thermoelectric conversion material 1 having a thickness exceeding 0.5 mm can be obtained since the semiconductor grains 15 are in contact with one another. In this manner, the temperature difference generated in the thermoelectric conversion material 1 can be increased, and output can be obtained by a high voltage. As such, according to the thermoelectric conversion material 1 of embodiment 1, a thermoelectric conversion material that has excellent thermoelectric conversion properties and enables high output is provided.

Figure 4:
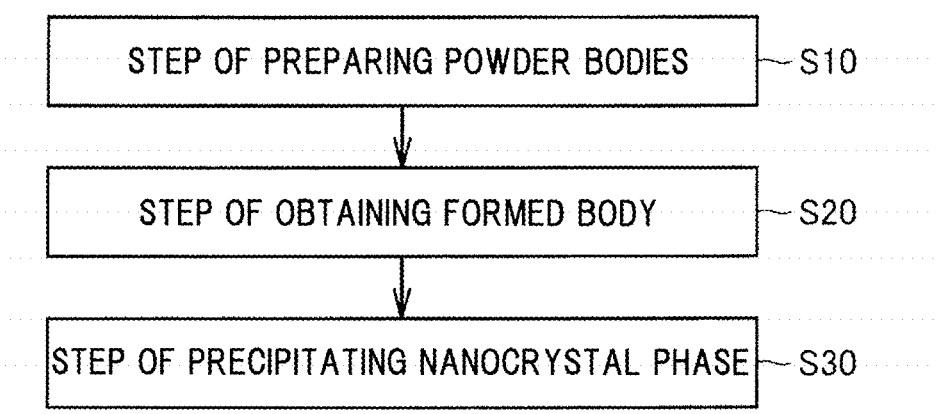
FIG. 4 is a flowchart illustrating the outline of a method for producing a thermoelectric conversion material according to embodiment 1.

Next, a method for producing the thermoelectric conversion material 1 according to embodiment 1 is described. FIG. 4 is a flowchart illustrating the outline of a method for producing the thermoelectric conversion material 1. Referring to FIG. 4, in the method for producing the thermoelectric conversion material 1 according to embodiment 1, a step of preparing powder bodies is first performed as a step (S10). In this step (S10), a raw material containing Mn and Si in amounts corresponding to the desired composition of the thermoelectric conversion material 1 is prepared. Specifically, for example, raw materials in amounts corresponding to the desired composition of the thermoelectric conversion material 1 are weighed and charged in a crucible. For example, boron nitride (BN) can be employed as the material constituting the crucible.

Next, a mother alloy having a composition corresponding to the desired composition of the thermoelectric conversion material 1 is prepared. Specifically, the raw material charged in the crucible in the step (S10) is heated in, for example, a high-frequency induction heating furnace to be in a molten state. Subsequently, the raw material in a molten state is solidified by natural cooling. Thus, a mother alloy is obtained. Next, a semiconductor material containing an amorphous phase is prepared from the mother alloy. Specifically, a material having a ribbon-like thin strip shape is obtained from the mother alloy by a liquid quenching method. The semiconductor material containing an amorphous phase is placed in a mortar or the like and pulverized. As a result, powder bodies composed of the semiconductor grains 15 containing the amorphous phases 22 are obtained.

Next, a step of obtaining a formed body is performed as the step (S20). More specifically, the powder bodies prepared in the step (S10) are placed in an anvil cell or the like and formed by applying isotropic pressure. As a result, a formed body is obtained. The forming by isotropic pressure involves forming by applying a pressure of 1.5 GPa or more. In this manner, a formed body having a thickness exceeding 0.5 mm can be obtained. The isotropic pressure is applied while the temperature is maintained at a temperature lower than the crystallization temperature (Td) of the powder bodies. The temperature during application of the isotropic pressure is preferably Td-50° C. or lower and more preferably Td-100° C. In this manner, crystallization of powder bodies composed of the semiconductor grains 15 containing the amorphous phases 22 can be suppressed. The crystallization temperature of the powder bodies is, for example, determined by the temperature of the changing point measured by differential thermal analysis.

Next, after the step (S20), a step of precipitating nanocrystal phases in the semiconductor grains is performed as the step (S30). More specifically, the obtained formed body is heat-treated to induce precipitation of nanocrystal phases. For example, a rapid thermal annealing (RTA) furnace is used to heat-treat the formed body. The heat treatment can be performed, for example, in a nitrogen atmosphere and under the conditions of heating to 300° C. to 500° C. and holding that temperature for 5 to 15 minutes. As a result, nanocrystal phases composed of crystals having a particle diameter of 15 nm or less are precipitated in parts of the amorphous phase. The thermoelectric conversion material 1 of embodiment 1 can be produced by the aforementioned steps.

Note that, in the step (S10), multiple powder bodies composed of the semiconductor grains 15 may be obtained from the raw material by a mechanical alloying method. The step (S30) may be omitted. In other words, the thermoelectric conversion material 1 does not have to contain the nanocrystal phases 23.

In order to obtain a thermoelectric conversion material in a thick bulk form, performing consolidation is considered. Examples of the consolidation method include a spark plasma sintering method and a hot press method. In the spark plasma sintering method or the hot press method, a pressure of about 50 MPa is applied, and sintering is performed at high temperature. Regarding the thermoelectric conversion material in which a structure containing an amorphous phase is formed to reduce the thermal conductivity, when consolidation is performed by the spark plasma sintering method or the hot press method, the thermoelectric conversion material becomes crystallized, and the thermal conductivity of the thermoelectric conversion material increases. Meanwhile, decreasing the temperature to suppress crystallization of the thermoelectric conversion material decreases the mechanical strength of the thermoelectric conversion material. For example, the hardness of such a thermoelectric conversion material is less than 0.4 GPa.

Here, in the method for producing the thermoelectric conversion material 1 of embodiment 1, a formed body is obtained by forming by applying a pressure of 1.5 GPa or more to the powder bodies. In this manner, a formed body in which adjacent powder bodies constituted by semiconductor grains 15 are in contact with one another is obtained. Thus, a thermoelectric conversion material 1 having high mechanical strength can be obtained. For example, the hardness of the thermoelectric conversion material 1 can be 2 GPa or more. The powder bodies composed of semiconductor grains 15 containing amorphous phases 22 are formed while maintaining the temperature to a temperature lower than or equal to the crystallization temperature of the powder bodies. In this manner, crystallization of the powder bodies is suppressed, and the decrease in thermal conductivity can be suppressed. As described above, a thermoelectric conversion material 1 having excellent thermoelectric conversion properties while maintaining high mechanical strength can be provided even when the forming temperature is lower than in the spark plasma sintering method or a hot press method. Thus, according to the method for producing the thermoelectric conversion material 1 of embodiment 1, a thermoelectric conversion material having high mechanical strength and excellent thermoelectric conversion properties is provided.

Embodiment 2

Next, a π-type thermoelectric conversion element, which is one embodiment of the thermoelectric conversion material of the present disclosure, is described.

Figure 5:
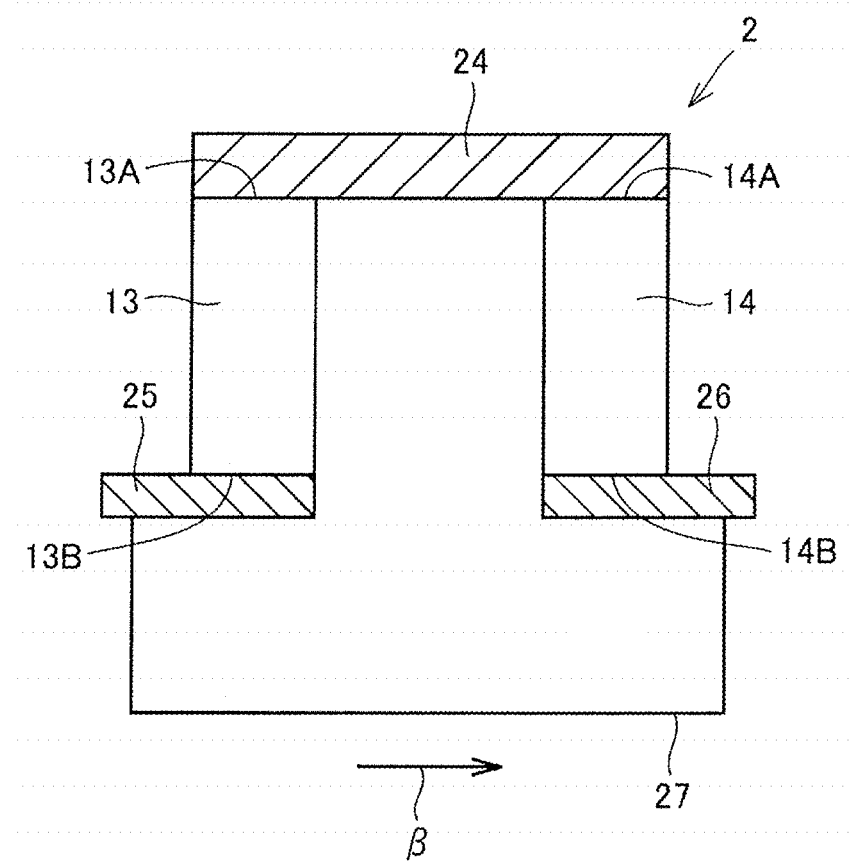
FIG. 5 is a schematic diagram illustrating a structure of a π-type thermoelectric conversion element, which is a thermoelectric conversion element of embodiment 2.

FIG. 5 is a schematic diagram illustrating a structure of a π-type thermoelectric conversion element 2, which is a thermoelectric conversion element of embodiment 2. Referring to FIG. 5, the π-type thermoelectric conversion element 2 includes a p-type thermoelectric conversion material unit 13 that serves as a first thermoelectric conversion material unit, an n-type thermoelectric conversion material unit 14 which serves as a second thermoelectric conversion material unit, a high-temperature-side electrode 24, a first low-temperature-side electrode 25, a second low-temperature-side electrode 26, and a wire 27.

The p-type thermoelectric conversion material unit 13 is, for example, composed of the thermoelectric conversion material 1 of embodiment 1 in which the component composition is adjusted to set the conductivity type to p-type. The conductivity type of the p-type thermoelectric conversion material unit 13 is set to p-type, for example, by doping the semiconductor material constituting the p-type thermoelectric conversion material unit 13 with a p-type impurity that generates a p-type carrier (holes) that serves as a majority carrier.

The n-type thermoelectric conversion material unit 14 is, for example, composed of the thermoelectric conversion material 1 of embodiment 1 in which the component composition is adjusted to set the conductivity type to n-type. The conductivity type of the n-type thermoelectric conversion material unit 14 is set to n-type, for example, by doping the semiconductor material constituting the n-type thermoelectric conversion material unit 14 with an n-type impurity that generates an n-type carrier (electrons) that serves as a majority carrier.

The p-type thermoelectric conversion material unit 13 and the n-type thermoelectric conversion material unit 14 are arranged side-by-side with a space therebetween. The high-temperature-side electrode 24 is arranged to extend from one end portion 13A of the p-type thermoelectric conversion material unit 13 to one end portion 14A of the n-type thermoelectric conversion material unit 14. The high-temperature-side electrode 24 is arranged to contact both the end portion 13A of the p-type thermoelectric conversion material unit 13 and the end portion 14A of the n-type thermoelectric conversion material unit 14. The high-temperature-side electrode 24 is arranged to connect the end portion 13A of the p-type thermoelectric conversion material unit 13 and the end portion 14A of the n-type thermoelectric conversion material unit 14. The high-temperature-side electrode 24 is composed of, for example, a conductive material such as a metal. The high-temperature-side electrode 24 makes an ohmic contact with the p-type thermoelectric conversion material unit 13 and the n-type thermoelectric conversion material unit 14.

The first low-temperature-side electrode 25 is arranged to contact another end portion 13B of the p-type thermoelectric conversion material unit 13. The first low-temperature-side electrode 25 is arranged to be apart from the high-temperature-side electrode 24. The first low-temperature-side electrode 25 is composed of, for example, a conductive material such as a metal. The first low-temperature-side electrode 25 makes an ohmic contact with the p-type thermoelectric conversion material unit 13.

The second low-temperature-side electrode 26 is arranged to contact another end portion 14B of the n-type thermoelectric conversion material unit 14. The second low-temperature-side electrode 26 is arranged to be apart from the high-temperature-side electrode 24 and the first low-temperature-side electrode 25. The second low-temperature-side electrode 26 is composed of, for example, a conductive material such as a metal. The second low-temperature-side electrode 26 makes an ohmic contact with the n-type thermoelectric conversion material unit 14.

The wire 27 is composed of a conductor such as a metal. The wire 27 electrically connects the first low-temperature-side electrode 25 and the second low-temperature-side electrode 26.

In the π-type thermoelectric conversion element 2, when, for example, a temperature difference is formed between the high temperature at the end portion 13A of the p-type thermoelectric conversion material unit 13 and the end portion 14A of the n-type thermoelectric conversion material unit 14 and the low temperature at the end portion 13B of the p-type thermoelectric conversion material unit 13 and the end portion 14B of the n-type thermoelectric conversion material unit 14, the p-type carrier (holes) migrates in the p-type thermoelectric conversion material unit 13 from the end portion 13A toward the end portion 13B. During this process, in the n-type thermoelectric conversion material unit 14, the n-type carrier (electrons) migrates from the end portion 14A toward the end portion 14B. As a result, an electric current flows in the wire 27 in the arrow β direction. Thus, in the π-type thermoelectric conversion element 2, power is generated by thermoelectric conversion using the temperature difference.

In the π-type thermoelectric conversion element 2 of embodiment 2, the p-type thermoelectric conversion material unit 13 and the n-type thermoelectric conversion material unit 14 are composed of the thermoelectric conversion material 1 that has excellent thermoelectric conversion properties and enables high output, in which the component composition is adjusted to set the conductivity type to p-type or n-type. Thus, the π-type thermoelectric conversion element 2 exhibits excellent conversion efficiency and enables high output.

In the embodiment described above, a π-type thermoelectric conversion element is described as one example of the thermoelectric conversion element of the present disclosure, but the thermoelectric conversion element of the present disclosure is not limited to this. The thermoelectric conversion element of the present disclosure may have other structures such as an I-type (uni-leg type) thermoelectric conversion element, for example.

Examples

The contents of the experiments performed on the prepared thermoelectric conversion material of the present disclosure to investigate the properties thereof will now be described.

The experimental procedure was as follows.

Raw materials were weighed so that the Al, Mn, and Si compositional ratios were respectively 34 at %, 22 at %, and 44 at %, and charged into a crucible. The raw materials were melted in a high-frequency induction heating furnace. The resulting raw material was solidified by natural cooling, and a mother alloy was obtained thereby. Subsequently, a semiconductor material having a ribbon-like thin strip shape was prepared from the obtained mother alloy by a liquid quenching method. The compositional formula for the semiconductor material was $Mn_{1.00}Si_{2.00}Al_{1.55}$. The semiconductor material was subjected to X-ray diffraction (XRD) analysis. The obtained results are indicated in FIG. 6.

Figure 6:
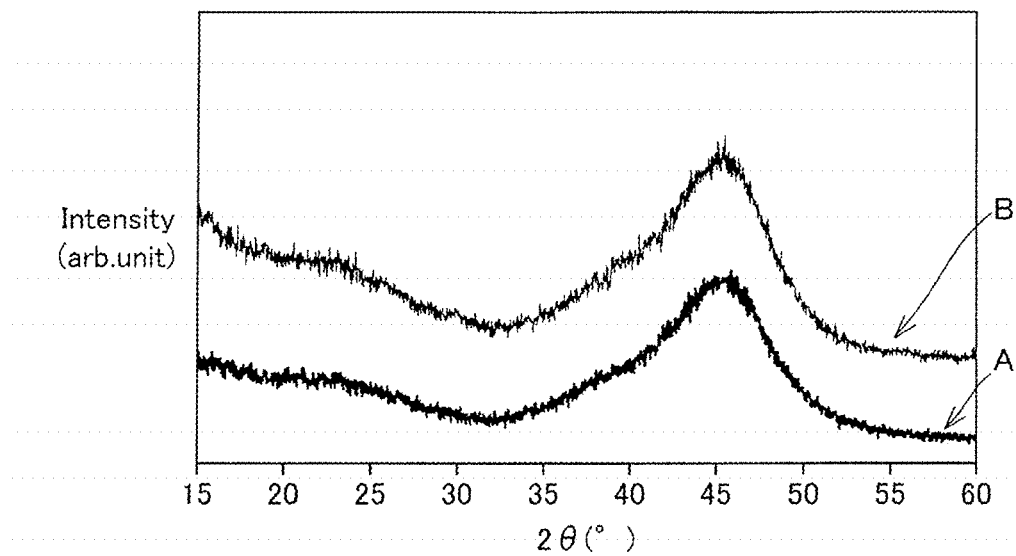
FIG. 6 is a schematic diagram illustrating the results of XRD analysis.

In FIG. 6, the horizontal axis indicates the diffraction angle (2θ) and the vertical axis indicates the diffraction intensity.

In FIG. 6, A indicates the result of the XRD analysis performed on the semiconductor material. Referring to FIG. 6, in the XRD analysis of the semiconductor material, a broad pattern was detected in a region that spans from a diffraction angle (2θ) of 40° to 50°. In FIG. 6, there are no peaks that correspond to crystal planes of a particular substance. This confirmed that the semiconductor material had a structure composed of an amorphous phase.

Figure 7:
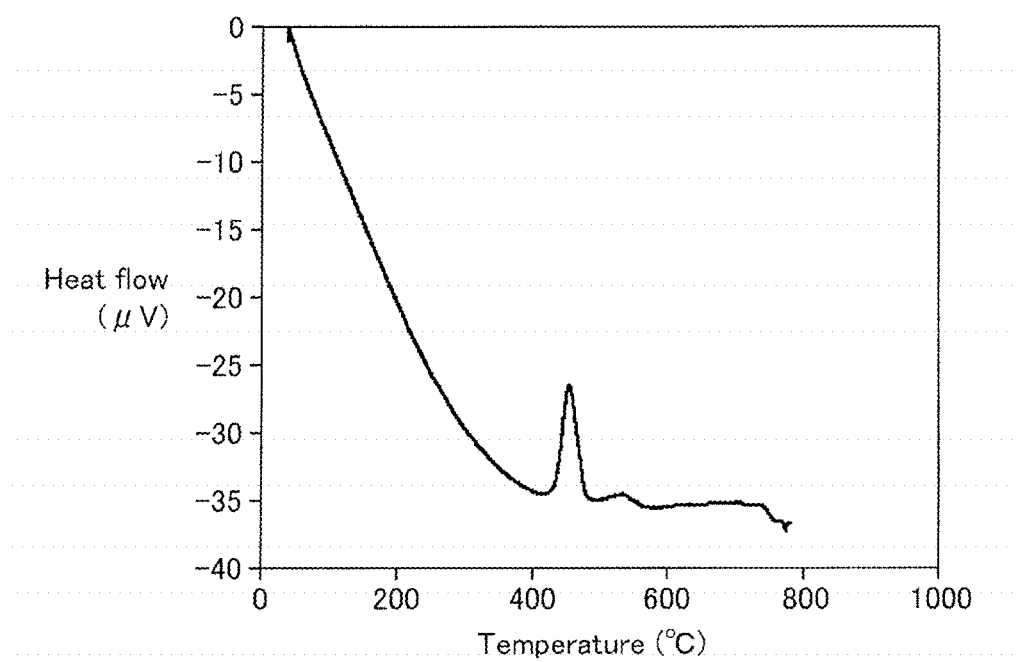
FIG. 7 is a diagram illustrating results of differential thermal analysis.

The semiconductor material was subjected to differential thermal analysis. The results of analysis are indicated in FIG. 7. In FIG. 7, the horizontal axis indicates the temperature, and the vertical axis indicates the heat flow. Referring to FIG. 7, a peak corresponding to the crystallization of the amorphous phase is found at around 450° C. Thus, the crystallization temperature of the powder bodies is determined to be 450° C.

Next, the obtained semiconductor material was placed in a mortar and pulverized to prepare powder bodies composed of semiconductor grains 15. The powder bodies were placed in an anvil cell, formed by applying isotropic pressure of 3 GPa in a 23° C. environment, and a formed body (sample No. 1) was obtained as a result. The pressure application time was 10 minutes. The thickness of the sample No. 1 was 0.6 mm. The sample No. 1 was subjected to the XRD analysis. In FIG. 6, B indicates the result of the XRD analysis performed on the thermoelectric conversion material 1. Referring to FIG. 6, as with the XRD analysis results of the semiconductor material, a broad pattern was detected in a region that spans from a diffraction angle (2θ) of 40° to 50°. This confirms that the formed body of sample No. 1 retained the amorphousness and crystallization was suppressed. Thus, in sample No. 1, the decrease in thermal conductivity is suppressed. Thus, according to the method for producing a thermoelectric conversion material of the present disclosure, a thermoelectric conversion material excellent thermoelectric conversion properties can be provided.

The hardness was measured with a nanoindenter in accordance with ISO 14577:2002. More specifically, measurement was performed with a nanoindenter (for example, iMicro produced by Nanomechanics, Inc.) at an indentation depth of 2 um, an oscillation frequency of 100 Hz, and an amplitude of oscillation of 2 nm. Measurement was carried out on ten points, and the average value was determined. The hardness of the formed body of sample No. 1 was measured and was 3±1 GPa. The hardness of thermoelectric conversion materials composed of $Bi_2Te_3$-based semiconductor materials put to actual use is about 0.4 GPa. The hardness of the formed body of sample No. 1 is significantly larger than 0.4 GPa. Thus, sample No. 1 is considered to be a thermoelectric conversion material having a high mechanical strength compared to thermoelectric conversion materials composed of $Bi_2Te_3$-based semiconductor materials put to actual use. As such, according to the method for producing a thermoelectric conversion material of the present disclosure, a thermoelectric conversion material having high mechanical strength can be provided.

The embodiments and examples disclosed herein are exemplary in all aspects, and should not be understood as limiting from any respect. The scope of the present invention is defined not by the meaning described above but by the claims and is intended to include all alterations and modifications within the meaning of the claims and equivalents thereof.

REFERENCE SIGNS LIST 1 thermoelectric conversion material
2 thermoelectric conversion element
11 first main surface
12 second main surface
13 p-type thermoelectric conversion material unit
13A, 13B end portion
14 n-type thermoelectric conversion material unit
14A, 14B end portion
15 semiconductor grain
20 particle
21 oxidized layer
22 amorphous phase 23 nanocrystal phase
24 high-temperature-side electrode
25 first low-temperature-side electrode
26 second low-temperature-side electrode
27 wire

The invention claimed is:

1. The A thermoelectric conversion material having a plate shape and having a first main surface and a second main surface on the opposite side of the first main surface, the thermoelectric conversion material comprising:
   a plurality of semiconductor grains that are in contact with one another,
   wherein each of the semiconductor grains has a particle composed of a semiconductor containing an amorphous phase, and an oxidized layer that covers the particle,
   wherein a distance between the first main surface and the second main surface exceeds 0.5 mm, and
   wherein the particle contains a nanocrystal phase precipitated in the amorphous phase, the nanocrystal phase consisting of a crystal having a particle diameter of less than 15 nm.

2. The thermoelectric conversion material according to claim 1, wherein the first main surface and the second main surface have a hardness of 2 GPa or more.

3. The thermoelectric conversion material according to claim 1, wherein the first main surface and the second main surface have a Young's modulus of 40 GPa or more.

4. The thermoelectric conversion material according to claim 1, wherein the nanocrystal phase has a particle diameter of less than 6 nm.

5. The thermoelectric conversion material according to claim 1, wherein the particle is an MnSi-based material containing Mn and Si.

6. The thermoelectric conversion material according to claim 1, wherein the particle is an SiGe-based material containing Si and Ge.

7. The thermoelectric conversion material according to claim 1, wherein the particle is a BiTe-based material containing Bi and Te, an SnSe-based material containing Sn and Se, or a CuSe-based material containing Cu and Se.

8. The thermoelectric conversion material according to claim 5, wherein the particle is represented by a compositional formula, $Mn_XSi_Y$, where $0.90 \leq X \leq 1.10$ and $0.75 \leq Y \leq 5.70$ are satisfied.

9. The thermoelectric conversion material according to claim 5, wherein the particle contains Mn, Si, and Al, and is represented by a compositional formula, $Mn_XSi_YAl_Z$, where $0.40 \leq X \leq 1.0$, $0.00 < Z \leq 3.67$, $1.50 \leq Y+Z \leq 5.70$, and $Y \geq 0.43Z$ are satisfied.

10. The thermoelectric conversion material according to claim 6, wherein the particle is represented by a compositional formula, $Si_ZGe_{1-Z}$, where $0 < Z < 1$ is satisfied.

11. The thermoelectric conversion material according to claim 1, wherein the particle further contains 30 at % or less of at least one element selected from the group consisting of Cu, Ni, Fe, and Au.

12. The thermoelectric conversion material according to claim 11, wherein the particle further contains 10 at % or less of at least one element selected from the group consisting of Cu, Ni, Fe, and Au.

13. The thermoelectric conversion material according to claim 12, wherein the particle further contains 1 at % or less of at least one element selected from the group consisting of Cu, Ni, Fe, and Au.

14. The thermoelectric conversion material according to claim 11, wherein the particle contains 0.01 at % or more of at least one element selected from the group consisting of Cu, Ni, Fe, and Au.

15. The thermoelectric conversion material according to claim 1, wherein the thermoelectric conversion material has a Seebeck coefficient of 50 µV/K or more.

16. A thermoelectric conversion element comprising:
    a thermoelectric conversion material unit;
    a first electrode disposed to be in contact the thermoelectric conversion material unit; and
    a second electrode disposed to be in contact the thermoelectric conversion material unit and to be away from the first electrode,
    wherein the thermoelectric conversion material unit consists of the thermoelectric conversion material according to claim 1, the thermoelectric conversion material having a component composition adjusted to set a conductivity type to p-type or n-type.

* * * * *